United States Patent
Kang

(10) Patent No.: US 9,419,223 B2
(45) Date of Patent: Aug. 16, 2016

(54) ORGANIC LIGHT-EMITTING DISPLAY DEVICE AND METHOD OF MANUFACTURING THE SAME

(71) Applicant: SAMSUNG DISPLAY CO., LTD., Yongin, Gyeonggi-Do (KR)

(72) Inventor: Yoon-Ho Kang, Yongin (KR)

(73) Assignee: SAMSUNG DISPLAY CO., LTD. (KR)

( * ) Notice: Subject to any disclaimer, the term of this patent is extended or adjusted under 35 U.S.C. 154(b) by 107 days.

(21) Appl. No.: 14/096,995

(22) Filed: Dec. 4, 2013

(65) Prior Publication Data

US 2015/0001485 A1  Jan. 1, 2015

(30) Foreign Application Priority Data

Jul. 1, 2013 (KR) .................. 10-2013-0076603

(51) Int. Cl.
*H01L 51/00* (2006.01)
*H01L 27/32* (2006.01)

(52) U.S. Cl.
CPC ........ *H01L 51/0005* (2013.01); *H01L 27/3246* (2013.01); *H01L 27/3211* (2013.01)

(58) Field of Classification Search
CPC ............ H01L 27/1259; H01L 27/3246; H01L 27/3248; H01L 27/326; H01L 27/3262; H01L 27/3276; H01L 51/0005; H01L 51/5203; H01L 2251/566
USPC ................... 257/233, 292, 367, 577, E27.016, 257/E27.31, E27.132, E27.152, E31.105, 257/E51.005, E51.022; 438/35, 149, 237, 438/328, FOR. 157, FOR. 184, FOR. 201, 438/FOR. 287
See application file for complete search history.

(56) References Cited

U.S. PATENT DOCUMENTS

| | | | |
|---|---|---|---|
| 2003/0011304 A1* | 1/2003 | Duineveld et al. ............ 313/506 |
| 2003/0201708 A1* | 10/2003 | Yamada et al. ............... 313/495 |
| 2005/0093441 A1 | 5/2005 | Uhlig et al. |
| 2007/0076061 A1* | 4/2007 | Watanabe et al. ............... 347/72 |
| 2012/0169217 A1 | 7/2012 | Kim et al. |

FOREIGN PATENT DOCUMENTS

| | | |
|---|---|---|
| JP | 2004-111166 A | 4/2004 |
| KR | 1020050041836 A | 5/2005 |
| KR | 1020070050722 A | 5/2007 |
| KR | 1020120078954 A | 7/2012 |

* cited by examiner

*Primary Examiner* — John P Dulka
*Assistant Examiner* — Joannie A Garcia
(74) *Attorney, Agent, or Firm* — Innovation Counsel LLP

(57) ABSTRACT

An organic light-emitting display device is provided. The organic light-emitting display device includes a plurality of first electrodes, wherein each first electrode corresponds to a sub-pixel. The display device also includes a pixel-defining layer comprising a plurality of first openings exposing at least a portion of the first electrodes, and a plurality of inlets disposed on an upper surface of the pixel-defining layer. The display device further includes an intermediate layer disposed on the exposed portion of the first electrodes and the inlets, and an opposite electrode disposed on the intermediate layer and the pixel-defining layer, wherein the inlets are selectively disposed between adjacent sub-pixels emitting light of a same wavelength.

19 Claims, 3 Drawing Sheets

US 9,419,223 B2

ORGANIC LIGHT-EMITTING DISPLAY DEVICE AND METHOD OF MANUFACTURING THE SAME

CROSS-REFERENCE TO RELATED APPLICATION

This application claims the benefit of Korean Patent Application No. 10-2013-0076603 filed on Jul. 1, 2013, the entire contents of which are incorporated herein by reference.

BACKGROUND

1. Technical Field

The present disclosure relates to an organic light-emitting display device and a method of manufacturing the same.

2. Description of the Related Art

Among display devices, organic light-emitting display devices have been identified as next generation display devices, due to their superior characteristics such as wide viewing angles, good contrast, and rapid response times.

Generally, an organic light-emitting device includes a pixel-defining layer covering edges of a pixel electrode and exposing a central portion of the pixel electrode. After the pixel-defining layer has been formed, an intermediate layer including a light-emitting layer is formed on the pixel electrode using methods such as inkjet printing or nozzle printing.

In the display device, each pixel electrode may constitute a sub-pixel. If the sub-pixels are disposed at varying pitches, the inkjet head will be required to dispense ink (for forming the intermediate layer) at the varying pitches. Accordingly, this may lead to deterioration in the inkjet printing process, and result in process defects such as ink stains on the display device.

SUMMARY

The present disclosure is directed to address at least the above problems relating to the formation of an intermediate layer in an organic light-emitting device using an inkjet printing or nozzle printing process.

According to some embodiments of inventive concept, an organic light-emitting display device is provided. The display device includes a plurality of first electrodes, wherein each first electrode corresponds to a sub-pixel; a pixel-defining layer comprising a plurality of first openings exposing at least a portion of the first electrodes and a plurality of inlets disposed on an upper surface of the pixel-defining layer; an intermediate layer disposed on the exposed portion of the first electrodes and in the inlets; and an opposite electrode disposed on the intermediate layer and the pixel-defining layer, wherein the inlets are selectively disposed between adjacent sub-pixels emitting light of a same wavelength.

In some embodiments, the inlets may be omitted between adjacent sub-pixels emitting light of different wavelengths.

In some embodiments, a first distance may correspond to a distance between respective centers of two adjacent drops of intermediate layer disposed at a first opening, a second distance may correspond to a distance from a center of an edgemost drop of intermediate layer disposed at the first opening and a center of an immediate adjacent drop of intermediate layer discharged at an inlet, and the first distance may be substantially equal to the second distance.

In some embodiments, a depth of an inlet may be about ¼ to about ½ of a thickness of the pixel-defining layer.

According to some other embodiments of the inventive concept, an organic light-emitting display device is provided. The display device includes a plurality of first electrodes, wherein each first electrode corresponds to a sub-pixel; a pixel-defining layer comprising a plurality of first openings exposing at least a portion of the first electrodes, and a plurality of second openings exposing at least a portion of a substrate; an intermediate layer disposed on the exposed portions of the first electrodes and the substrate; and an opposite electrode disposed on the intermediate layer and the pixel-defining layer, wherein the second openings are selectively disposed between adjacent sub-pixels emitting light of a same wavelength.

In some embodiments, the second openings may be omitted between adjacent sub-pixels emitting light of different wavelengths.

In some embodiments, a first distance may correspond to a distance from a center of a second opening to a center of a nearest adjacent first electrode, a second distance may correspond to a distance from the center of the second opening to a center of another nearest adjacent first electrode, and the first distance may be substantially equal to the second distance.

According to some further embodiments of the inventive concept, a method of manufacturing an organic light-emitting display device is provided. The method includes forming a plurality of first electrodes, wherein each first electrode corresponds to a sub-pixel; forming a pixel-defining layer comprising a plurality of first openings, wherein the first openings expose at least a portion of the first electrodes; forming an intermediate layer on the exposed portion of the first electrodes; and forming an opposite electrode on the intermediate layer and the pixel-defining layer.

In some embodiments, the method may include forming a plurality of inlets on an upper surface of the pixel-defining layer; and forming the intermediate layer on the exposed portion of the first electrodes and in the inlets, wherein the inlets may be selectively formed between adjacent sub-pixels emitting light of a same wavelength.

In some embodiments, the inlets may be omitted between adjacent sub-pixels emitting light of different wavelengths.

In some embodiments, a first distance may correspond to a distance between respective centers of two adjacent drops of intermediate layer disposed at a first opening, a second distance may correspond to a distance from a center of an edgemost drop of intermediate layer disposed at the first opening and a center of an immediate adjacent drop of intermediate layer discharged at an inlet, and the first distance may be substantially equal to the second distance.

In some embodiments, forming the pixel-defining layer may further include forming the first openings and the inlets in a same process step.

In some embodiments, the method may include forming a plurality of second openings in the pixel-defining layer for exposing at least a portion of a substrate; and forming the intermediate layer on the exposed portions of the first electrodes and the substrate, wherein the second openings may be selectively formed between adjacent sub-pixels emitting light of a same wavelength.

In some embodiments, the second openings may be omitted between adjacent sub-pixels emitting light of different wavelengths.

In some embodiments, a first distance may correspond to a distance from a center of a second opening to a center of a nearest adjacent first electrode, a second distance may correspond to a distance from the center of the second opening to a center of another nearest adjacent first electrode, and the first distance may be substantially equal to the second distance.

In some embodiments, forming the pixel-defining layer may further include forming the first openings and the second openings in a same process step.

In some embodiments, the method may further include forming the intermediate layer using an inkjet printing process.

In some embodiments, forming the intermediate layer may further include dispensing an ink, at a constant pitch, on the exposed portion of the first electrodes and into a plurality of inlets, wherein the inlets are formed on an upper surface of the pixel-defining layer.

In some embodiments, forming the intermediate layer may further include dispensing an ink, at a constant pitch, on the exposed portions of the first electrodes and a substrate, wherein the portion of the substrate is exposed through a plurality of second openings formed in the pixel-defining layer.

DETAILED DESCRIPTION

Figure 1:
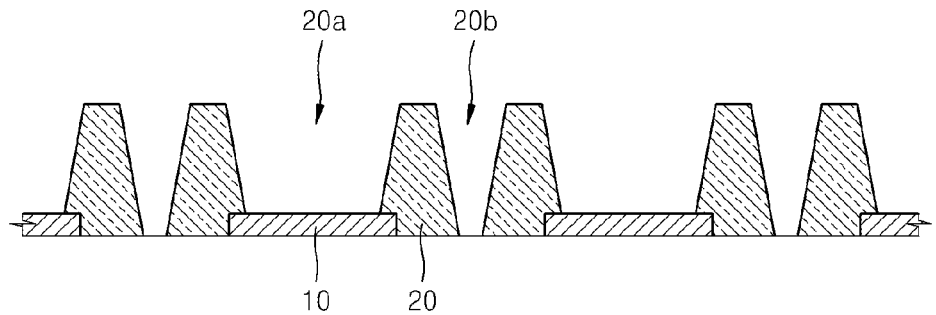
FIGS. 1 and 2 illustrate cross-sectional views of an organic light-emitting display device in accordance with an embodiment of the inventive concept.

The inventive concept will be described with reference to the embodiments illustrated in the drawings. Like reference numerals refer to like elements throughout the specification. The disclosed embodiments are merely exemplary, and the inventive concept should not be construed as being limited to the disclosed embodiments.

In the following description, an x-axis, a y-axis, and a z-axis should not be construed as being limited to the axes in a rectangular coordinate system. Instead, the axes may be defined broadly. For example, the x-axis, y-axis, and z-axis may be perpendicular to each other, or may be indicative of other directions that are non-perpendicular to each other.

When various elements (such as a layer, a film, a region, a plate, or other elements) are described as being disposed "on" another element, the elements may be disposed directly on the other element, or disposed on the other element with one or more intervening elements being present.

Figure 2:
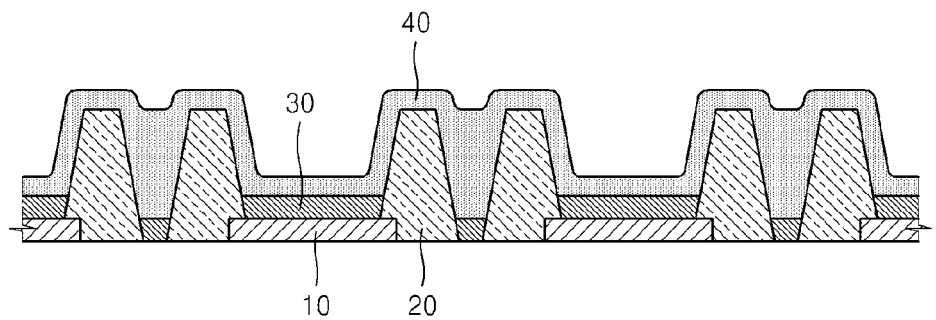
Figure 3:
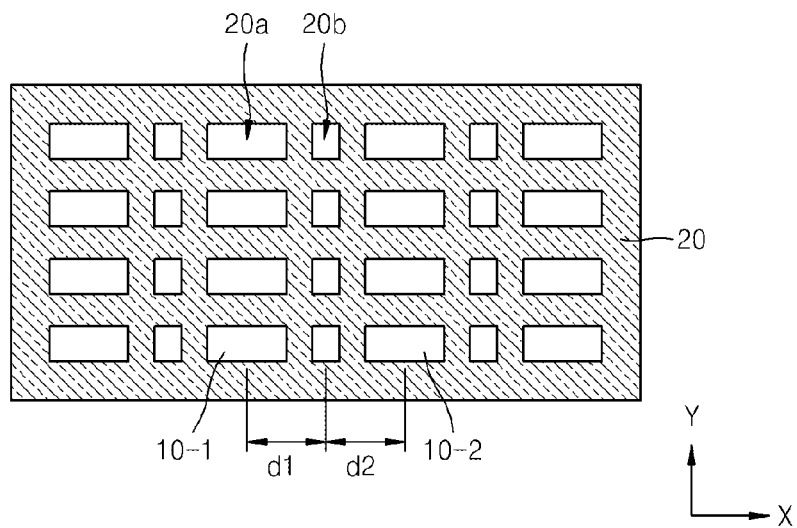
FIG. 3 illustrates a plan view of the display device of FIG. 1.

FIGS. 1 and 2 illustrate cross-sectional views of an organic light-emitting display device in accordance with an embodiment of the inventive concept. FIG. 3 illustrates a plan view of the display device of FIG. 1.

Referring to FIG. 1, an organic light-emitting display device includes a plurality of first electrodes 10 and a pixel-defining layer 20 disposed on a substrate (not shown). Each first electrode 10 corresponds to a sub-pixel. The plurality of first electrodes 10 (corresponding to the sub-pixels) may constitute pixel electrodes. The pixel-defining layer 20 includes a plurality of first openings 20a and second openings 20b. The first openings 20a expose at least a portion of the first electrodes 10, including central portions of the first electrodes 10. The second openings 20b expose at least an upper surface of the substrate.

The substrate may be formed of a light-transmitting material such as glass or plastics. Plastics may include polyethylene terephthalate (PET), polyethylene naphthalate (PEN), polyimide, or other similar materials.

The first electrodes 10 may be disposed on the substrate in different configurations. In some embodiments, the first electrodes 10 may be directly disposed on the substrate. In other embodiments, the first electrodes 10 may be disposed on the substrate with one or more intervening layers between the first electrodes 10 and the substrate. For example, in those other embodiments, a thin film transistor may be disposed on the substrate, a planarization layer may be disposed covering the thin film transistor, and the first electrodes 10 may be disposed on the planarization layer.

The first electrodes 10 may include a transparent electrode or a reflective electrode. The transparent electrode may include a layer formed of ITO, IZO, ZnO, or $In_2O_3$. The reflective electrode may include a reflective layer formed of Ag, Mg, Al, Pt, Pd, Au, Ni, Nd, Ir, Cr, or a compound thereof. The reflective electrode may also include a layer formed of ITO, IZO, ZnO, or $In_2O_3$.

The pixel-defining layer 20 may be formed of an organic insulating layer. The organic insulating layer may include an acryl polymer (such as polymethyl methacrylate (PMMA)), polystyrene (PS), a polymer derivative having a phenol group, an imide polymer, an arylether polymer, an amide polymer, a fluorine-based polymer, a p-xylene-based polymer, a vinyl alcohol-based polymer, or a mixture thereof.

As illustrated in FIGS. 1 and 3, the pixel-defining layer 20 includes the first openings 20a (exposing central portions of the first electrodes 10) and the second openings 20b (exposing an upper surface of the substrate). In some embodiments, the second openings 20b may be selectively disposed between adjacent sub-pixels emitting light of a same wavelength, and may not be disposed between adjacent sub-pixels emitting light of different wavelengths, as described in further detail below.

Referring to FIG. 3, a first distance d1 is defined as a distance from a center of a second opening 20b to a center of a nearest adjacent first electrode 10-1 (to the left of the second opening 20b). A second distance d2 is defined as a distance from the center of the second opening 20b to a center of a nearest adjacent first electrode 10-2 (to the right of the second opening 20b). Sub-pixels disposed horizontally along a same row in the x-direction may emit light of a same wavelength. Accordingly, the second openings 20b may be disposed at a central portion between adjacent sub-pixels emitting light of the same wavelength.

Referring back to FIG. 2, an intermediate layer 30 is disposed on the first electrodes 10 (in the first openings 20a) and the exposed surface of the substrate (in the second openings 20b). In some embodiments, the first distance d1 and the second distance d2 are the same, so as to produce a same pitch for the sub-pixels in the x-axis direction. Thus, when forming the intermediate layer 30 using an inkjet printing method, the ink may be dispensed onto the substrate at a constant pitch. The ink may also be dispensed from the inkjet head in a particular direction (e.g. the x-axis direction). Accordingly, the intermediate layer 30 is formed having a constant pitch, and is disposed between adjacent sub-pixels emitting light of a same wavelength.

In some embodiments, the intermediate layer 30 may include a low molecular weight organic material. In those embodiments, a hole transport layer (HTL), a hole injection layer (HIL), an electron transport layer (ETL), an electron injection layer (EIL), or other similar layers may be stacked together having an emission layer (EML) as a center layer. The organic material may include materials such as copper phthalocyanine (CuPc), N'-di(naphthalene-1-yl)-N, N'-diphenyl-benzidine (NPB), tris-8-hydroxyquilonine aluminium (Alq3), or other similar materials.

In other embodiments, the intermediate layer 30 may include a high molecular weight organic material. In those other embodiments, a hole transport layer (HTL) may be included in the intermediate layer 30. The HTL may include poly-(2,4)-ethylene-dihydroxy thiophene (PEDOT), polyaniline (PANI), or other similar materials. The organic material may include a poly-phenylenevinylene (PPV)-based polymer or a polyfluorene-based polymer.

It should be noted that the HTL, HIL, ETL, and EIL may be formed as a blanket multi-layer structure over the substrate, whereas the EML may be formed as a pixel unit on the substrate. The EML may be formed using an inkjet printing process. In some embodiments, the HTL, HIL, ETL, and EIL may be disposed in cavities (e.g. inlets 20b' of FIGS. 4 and 5) in the pixel-defining layer 20.

In some embodiments, an inorganic material may be disposed between the intermediate layer 30 and the first electrodes 10.

As illustrated in FIG. 2, an opposite electrode 40 is disposed on the intermediate layer 30 and the pixel-defining layer 20. The opposite electrode 40 may be disposed substantially filling the second openings 20b. In some embodiments, the opposite electrode 40 may be selectively disposed in the vicinity of the first electrodes 10. In other embodiments, the opposite electrode 40 may be disposed over the entire substrate.

The opposite electrode 40 may include a transparent electrode or a reflective electrode. When the opposite electrode 40 includes a transparent electrode, the opposite electrode 40 may be used as a cathode electrode. Accordingly, a metal layer including metals having a low work function (such as Li, Ca, LiF/Ca, LiF/Al, Al, Ag, Mg, or a compound thereof) may be disposed facing the intermediate layer 30, and an auxiliary electrode layer or a bus electrode line may be disposed on the metal layer. The auxiliary electrode layer or bus electrode line may include a material suitable for forming a transparent electrode (such as ITO, IZO, ZnO, or $In_2O_3$). When the opposite electrode 40 includes a reflective electrode, a metal layer including metals having a low function (similar to the metals listed above) may be disposed on the surface of the intermediate layer 30.

In some embodiments, an inorganic material may be disposed between the intermediate layer 30 and the opposite electrode 40

Referring to FIG. 3, the pixel-defining layer 20 includes the plurality of first openings 20a and second openings 20b, as previously mentioned. The first openings 20a expose central portions of the first electrodes 10, and the second openings 20b are disposed between the first openings 20a. Each first electrode 10 corresponds to a sub-pixel, and sub-pixels disposed along a same row in the x-axis direction may emit light of a same wavelength. Accordingly, the second openings 20b may be selectively disposed between adjacent sub-pixels emitting light of the same wavelength. As illustrated in FIG. 3, the second openings 20b are selectively disposed between adjacent sub-pixels in the x-axis direction, and are not disposed between adjacent sub-pixels in the y-axis direction.

Accordingly, in the embodiment of FIG. 3, the second openings 20b are disposed between adjacent sub-pixels emitting light of the same wavelength. As previously mentioned, the first distance d1 and the second distance d2 are the same, so as to produce a same pitch for the sub-pixels in the x-axis direction. Accordingly, when forming the intermediate layer 30 using an inkjet printing method, the ink may be dispensed onto the substrate at a same pitch (corresponding to the pitch of the sub-pixels), so as to form the intermediate layer 30 having a constant pitch. The ink may also be dispensed from the inkjet head in a single direction (e.g. along the x-axis direction). By dispensing the ink at a constant pitch in a same direction, a more stable and controlled inkjet printing process can be achieved, which minimizes process defects such as ink stains.

Figure 4:
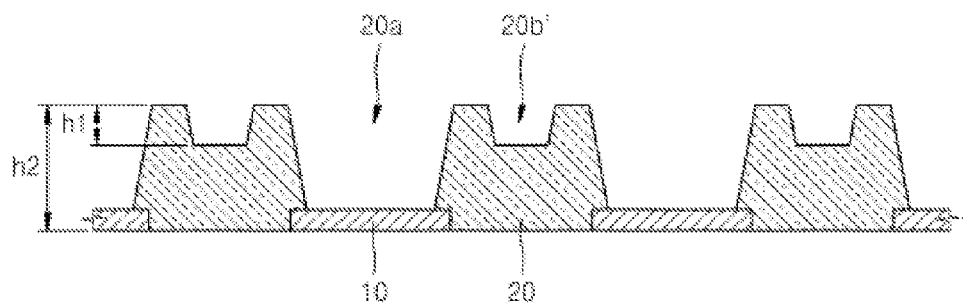
FIGS. 4 and 5 illustrate cross-sectional views of an organic light-emitting display device in accordance with another embodiment of the inventive concept.
Figure 5:
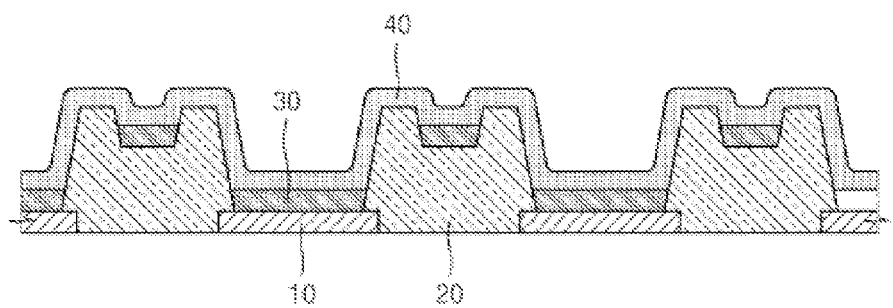
Figure 6:
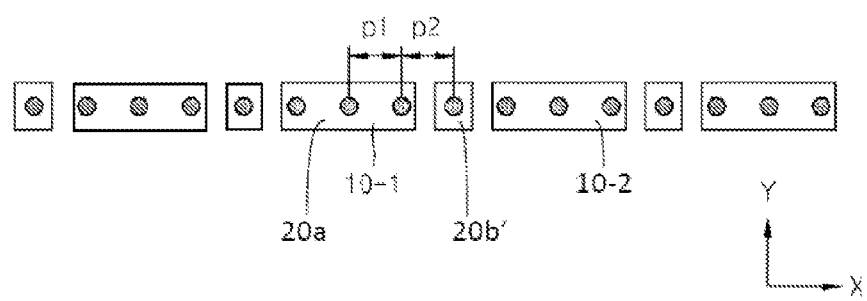
FIG. 6 illustrates a plan view of the display device of FIG. 4.

FIGS. 4 and 5 illustrate cross-sectional views of an organic light-emitting display device in accordance with another embodiment of the inventive concept. FIG. 6 illustrates a plan view of the display device of FIG. 4 with drops of ink (represented by the shaded circles). The display device of FIGS. 4 to 6 includes elements similar to those described previously in FIGS. 1 to 3, and thus detailed description of those elements shall be omitted.

Referring to FIG. 4, an organic light-emitting display device includes a plurality of first electrodes 10 and a pixel-defining layer 20 disposed on a substrate (not shown). Each first electrode 10 corresponds to a sub-pixel. The plurality of first electrodes 10 (corresponding to the sub-pixels) may constitute pixel electrodes. The pixel-defining layer 20 includes a plurality of first openings 20a and inlets 20b'. The first openings 20a expose at least a portion of the first electrodes 10, including central portions of the first electrodes 10. The inlets 20b' are disposed between adjacent first openings 20a.

As illustrated in FIG. 4, the inlets 20b' are formed as cavities (having a depth h1) in an upper surface of the pixel-defining layer 20. A thickness of the pixel-defining layer 20 is defined by a depth h2. In some embodiments, the inlets 20b' may be selectively disposed between adjacent sub-pixels emitting light of a same wavelength, and may not be disposed between adjacent sub-pixels emitting light of different wavelengths, as described in further detail below.

Referring to FIG. 6, the drops of ink may correspond to drops of an intermediate layer 30 dispensed at the first openings 20a and at the inlets 20b'. In some embodiments (not shown), the drops of ink may correspond to drops of another material that is dispensed on the intermediate layer 30 of FIG. 5. With reference to FIG. 6, a first distance p1 is defined as a distance between the centers of two adjacent drops of ink discharged at a first opening 20a. A second distance p2 is defined as a distance between the center of an edgemost drop of ink discharged at the first opening 20a and the center of an immediate adjacent drop of ink discharged at an inlet 20b'. The distance p1 may be equal to the distance p2. Sub-pixels disposed horizontally along a same row in the x-direction may emit light of a same wavelength. Accordingly, the inlets 20b' may be disposed at a central portion between adjacent sub-pixels emitting light of the same wavelength.

Referring back to FIG. 5, the intermediate layer 30 is disposed on the first electrodes 10 (in the first openings 20a) and in the inlets 20b'. In some embodiments, the first distance p1 and the second distance p2 are the same, so as to produce a same pitch for the sub-pixels in the x-axis direction. Thus, when forming the intermediate layer 30 using an inkjet printing method, the ink may be dispensed onto the substrate at a constant pitch. The ink may also be dispensed from the inkjet head in a particular direction (e.g. the x-axis direction). Accordingly, the intermediate layer 30 is formed having a constant pitch, and is disposed between adjacent sub-pixels emitting light of the same wavelength.

In order to increase a resolution of the display device, a distance between adjacent first electrodes 10 may need to be reduced. Since the inlets 20b' are disposed in the space between adjacent first electrodes 10, the reduced distance (between adjacent first electrodes 10) may lead to process challenges when forming the inlets 20b'. For example, formation of the inlets 20b' may be rendered more difficult when the distance between adjacent first electrodes 10 has been reduced and the depth h1 of the inlets 20b' is more than ½ of the thickness h2 of the pixel-defining layer 20. Accordingly, in some embodiments, the depth h1 may preferably be less than about ½ of the thickness h2.

However, in some embodiments, if the depth h1 is less than about ¼ of the thickness h2, the inlets 20b' may be too shallow. Thus, when ink (for forming an intermediate layer 30) is dispensed into inlets 20b' that are too shallow, the ink may overflow from the inlets 20b'. Accordingly, in some embodiments, the depth h1 of the inlet 20b' may preferably range from about ¼ to about ½ of the thickness h2 of the pixel-defining layer 20.

As illustrated in FIG. 5, an opposite electrode 40 is disposed on the intermediate layer 30 and the pixel-defining layer 20. The opposite electrode 40 may be disposed conformally over the structure of FIG. 4. In some embodiments, the opposite electrode 40 may be selectively disposed in the vicinity of the first electrodes 10. In other embodiments, the opposite electrode 40 may be disposed over the entire substrate.

Referring to FIG. 6, the pixel-defining layer 20 includes the plurality of first openings 20a and inlets 20b', as previously mentioned. The first openings 20a expose central portions of the first electrodes 10, and the inlets 20b' are disposed between the first openings 20a. Each first electrode 10 corresponds to a sub-pixel, and sub-pixels disposed along a same row in the x-axis direction may emit light of a same wavelength. The inlets 20b' may be selectively disposed between adjacent sub-pixels emitting light of the same wavelength. As illustrated in FIG. 6, the inlets 20b' are selectively disposed between adjacent sub-pixels in the x-axis direction. Similar to the embodiment of FIG. 3, the inlets 20b' in FIG. 6 are not disposed between adjacent sub-pixels in the y-axis direction (not shown).

Accordingly, in the embodiment of FIG. 6, the inlets 20b' are disposed between adjacent sub-pixels emitting light of the same wavelength. As previously mentioned, the first distance p1 and the second distance p2 are the same, so as to produce a same pitch for the sub-pixels in the x-direction. Accordingly, when forming the intermediate layer 30 using an inkjet printing method, the ink may be dispensed onto the substrate at a same pitch (corresponding to the pitch of the sub-pixels), so as to form the intermediate layer 30 having a constant pitch. The ink may also be dispensed from the inkjet head in a single direction (e.g. along the x-axis direction). By dispensing the ink at a constant pitch in a same direction, a more stable and controlled inkjet printing process can be achieved, which minimizes process defects such as ink stains.

Next, a method of manufacturing the organic light-emitting display device of FIGS. 1 to 3 will be described.

Referring to FIG. 1, a plurality of first electrodes 10 and a pixel-defining layer 20 are formed on a substrate (not shown). The first electrodes 10 may be formed by depositing and patterning a transparent electrode or a reflective electrode on the substrate. The pixel-defining layer 20 may be formed by depositing and patterning an organic insulating layer on the first electrodes 10 and the substrate.

Each first electrode 10 corresponds to a sub-pixel. The pixel-defining layer 20 includes a plurality of first openings 20a and second openings 20b formed in the pixel-defining layer 20. The first openings 20a expose at least a portion of the first electrodes 10, including central portions of the first electrodes 10. The second openings 20b expose at least an upper surface of the substrate.

As mentioned previously, the second openings 20b may be selectively formed between adjacent sub-pixels emitting light of the same wavelength in the x-axis direction, and may not be formed between adjacent sub-pixels emitting light of different wavelengths in the y-axis direction.

Next, referring to FIG. 2, an intermediate layer 30 is formed on the first electrodes 10 (in the first openings 20a) and the exposed surface of the substrate (in the second openings 20b). The intermediate layer 30 may be formed using an inkjet printing process, by dispensing ink (for forming the intermediate layer 30) onto the first electrodes 10 and into the second openings 20b. The intermediate layer 30 may be formed as island-shaped pixels on the display device.

As previously mentioned with reference to FIG. 3, the first distance d1 and the second distance d2 are the same, so as to produce a same pitch for the sub-pixels. Thus, when forming the intermediate layer 30 using the inkjet printing method, the ink may be dispensed onto the substrate at a same pitch in a single direction. Accordingly, the intermediate layer 30 is formed having a constant pitch, and is disposed between adjacent sub-pixels emitting light of the same wavelength.

Referring to FIG. 2, an opposite electrode 40 is formed on the intermediate layer 30 and the pixel-defining layer 20. As shown in FIG. 2, the opposite electrode 40 is formed substantially filling the second openings 20b.

Next, a method of manufacturing the organic light-emitting display device of FIGS. 4 to 6 will be described.

Referring to FIG. 4, a plurality of first electrodes 10 and a pixel-defining layer 20 are formed on a substrate (not shown). The first electrodes 10 may be formed by depositing and patterning a transparent electrode or a reflective electrode on the substrate. The pixel-defining layer 20 may be formed by depositing and patterning an organic insulating layer on the first electrodes 10 and the substrate.

Each first electrode 10 corresponds to a sub-pixel. The pixel-defining layer 20 includes a plurality of first openings 20a and inlets 20b' formed in the pixel-defining layer 20. The first openings 20a expose at least a portion of the first electrodes 10, including central portions of the first electrodes 10. The inlets 20b' are formed between adjacent first openings 20a. As shown in FIG. 4, the inlets 20b' are formed as cavities (having a depth h1) in an upper surface of the pixel-defining layer 20. The pixel-defining layer 20 may be formed having a thickness defined by a depth h2. In some embodiments, the inlets 20b' may be formed having a depth h1 ranging from about ¼ to about ½ of the thickness h2 of the pixel-defining layer 20.

In some embodiments, the inlets 20b' and the first openings 20a may be formed simultaneously during patterning of the pixel-defining layer 20. In those embodiments, the inlets 20b' and the first openings 20a may be formed using a half-tone mask or a slit mask. In some other embodiments, the inlets 20b' and the first openings 20a may be formed sequentially using more than one process step.

As mentioned previously, the inlets 20b' may be selectively formed between adjacent sub-pixels emitting light of the same wavelength in the x-axis, and may not be formed between adjacent sub-pixels emitting light of different wavelengths.

Next, referring to FIG. 5, an intermediate layer 30 is formed on the first electrodes 10 (in the first openings 20a) and in the inlets 20b'. The intermediate layer 30 may be formed using an inkjet printing process, by dispensing ink (for forming the intermediate layer 30) onto the first electrodes 10 and into the inlets 20b'. The intermediate layer 30 may be formed as island-shaped pixels on the display device.

As previously mentioned with reference to FIG. 6, the first distance p1 and the second distance p2 are the same, so as to produce a same pitch for the sub-pixels. Thus, when forming the intermediate layer 30 using the inkjet printing method, the ink may be dispensed onto the substrate at a same pitch in a single direction. Accordingly, the intermediate layer 30 is formed having a constant pitch, and is disposed between adjacent sub-pixels emitting light of the same wavelength.

Next, an opposite electrode 40 is formed on the intermediate layer 30 and the pixel-defining layer 20. As shown in FIG. 5, the opposite electrode 40 is formed conformally over the structure of FIG. 4.

Figure 7:
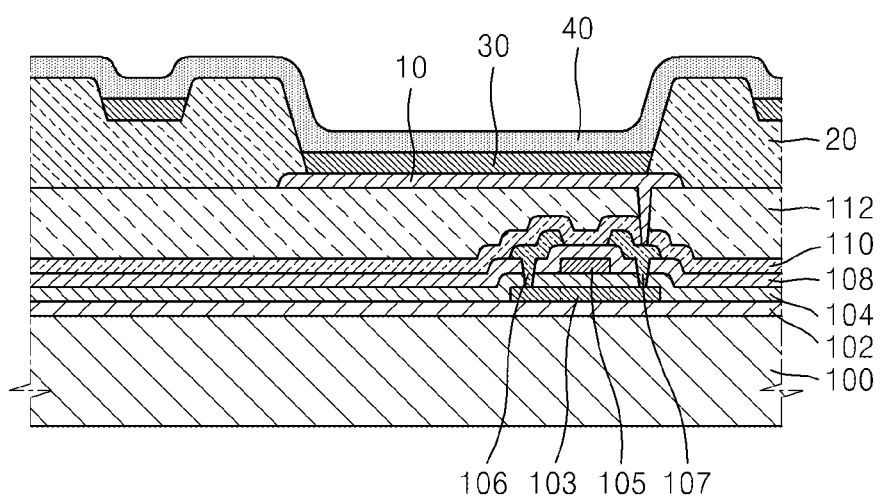
FIG. 7 illustrates a cross-sectional view of an organic light-emitting display device in accordance with a further embodiment of the inventive concept.

FIG. 7 illustrates a cross-sectional view of an organic light-emitting display device in accordance with a further embodiment of the inventive concept.

Referring to FIG. 7, the organic light-emitting display device includes various elements disposed on a substrate 100. The substrate 100 may be formed of a light-transmitting material, such as glass, plastic, or a transparent metallic material.

As shown in FIG. 7, a buffer layer 102 is disposed on the substrate 100. A semiconductor layer 103 is disposed on a portion of the buffer layer 102. A gate insulating layer 104 is disposed on the buffer layer 102 and the semiconductor layer 103. A gate electrode 105 is disposed on the gate insulating layer 104 directly above the semiconductor layer 103. An intermediate insulating layer 108 is disposed on the gate insulating layer 104 and the gate electrode 105. A source electrode 106 and a drain electrode 107 are formed by etching vias in the gate insulating layer 104 and intermediate insulating layer 108 (so as to expose portions of the semiconductor layer 103), and filling the vias with conductive material. The semiconductor layer 103, gate electrode 105, source electrode 106, and drain electrode 107 collectively constitute a thin film transistor (TFT). A passivation layer 110 is disposed on the intermediate insulating layer 108 and source/drain electrodes 106/107. A planarization layer 112 is disposed on the protection layer 110 to provide a top planar surface.

The buffer layer 102 may be formed as a single layer or a multi-layer structure. The buffer layer 102 may include silicon nitride or silicon oxide.

The gate electrode 105, source electrode 106, and drain electrode 107 may include least one of the following metals: aluminium (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu). Each of the gate electrode 105, source electrode 106, and drain electrode 107 may be formed as a single layer or a multi-layer structure.

The gate insulating layer 104, intermediate insulating layer 108, and passivation layer 110 may include an inorganic insulating material (such as $SiO_2$, $SiN_x$, SiON, $Al_2O_3$, $TiO_2$, $Ta_2O_5$, $HfO_2$, $ZrO_2$, BST, PZT, or other similar materials).

The planarization layer 112 may be formed over the entire surface of the substrate 100. The planarization layer 112 may be formed of an inorganic insulating material.

An organic light-emitting device (OLED) is disposed on the planarization layer 112. The OLED includes a first electrode 10 (pixel electrode), a pixel-defining layer 20, an intermediate layer 30, and an opposite electrode 40.

The intermediate layer 30 may be formed as a multi-layered structure disposed between the first electrode 10 and the opposite electrode 40. The intermediate layer 30 may include a light-emitting layer. The intermediate layer 30 may also be disposed in regions outside of the first electrodes 10. For example, as shown in FIG. 7, the intermediate layer 30 may be disposed in the cavities of the pixel-defining layer 20. The cavities may correspond, for example, to the inlets 20b' depicted in FIGS. 4 and 5.

The first electrode 10 is electrically connected to the TFT through a via hole etched in the planarization layer 112 and passivation layer 110. The pixel-defining layer 20 is disposed on the planarization layer 112 and first electrode 10, and includes an opening defining a pixel region of the first electrode 10. In some embodiments, the pixel-defining layer 20 may include the first openings 20a and inlets 20b' depicted in FIGS. 4 to 6. In other embodiments, the pixel-defining layer 20 may include the first openings 20a and second openings 20b depicted in FIGS. 1 to 3.

It should be understood that the above-described embodiments are merely exemplary, and should not be construed as limiting the inventive concept.

While the inventive concept has been described with reference to exemplary embodiments, it will be understood by those of ordinary skill in the art that various modifications may be made to the described embodiments without departing from the spirit and scope of the disclosure.

What is claimed is:

1. An organic light-emitting display device comprising:
 a plurality of first electrodes, wherein each first electrode corresponds to a sub-pixel;
 a pixel-defining layer comprising a plurality of first openings exposing at least a portion of the first electrodes and a plurality of inlets disposed on an upper surface of the pixel-defining layer and having a depth smaller than a thickness of the pixel-defining layer;
 an intermediate layer including an organic material disposed on the exposed portion of the first electrodes and in the inlets; and
 an opposite electrode disposed on the intermediate layer and the pixel-defining layer,
 wherein the inlets are selectively disposed between adjacent sub-pixels emitting light of a same wavelength.

2. The display device of claim 1, wherein the inlets are omitted between adjacent sub-pixels emitting light of different wavelengths.

3. The display device of claim 1,
 wherein a first distance corresponds to a distance between respective centers of two adjacent drops of intermediate layer disposed at a first opening, a second distance corresponds to a distance from a center of an edgemost drop of intermediate layer disposed at the first opening and a center of an immediate adjacent drop of intermediate layer discharged at an inlet, and the first distance is substantially equal to the second distance.

4. The display device of claim 1, wherein the depth of an inlet is about ¼ to about ½ of the thickness of the pixel-defining layer.

5. An organic light-emitting display device comprising:
 a plurality of first electrodes, wherein each first electrode corresponds to a sub-pixel;
 a pixel-defining layer comprising a plurality of first openings exposing at least a portion of the first electrodes, and a plurality of second openings exposing at least a portion of a substrate;
 an intermediate layer disposed on the exposed portions of the first electrodes and the substrate in the plurality of second openings; and an opposite electrode disposed on the intermediate layer and the pixel-defining layer,
wherein the second openings are selectively disposed between adjacent sub-pixels emitting light of a same wavelength.

6. The display device of claim 5, wherein the second openings are omitted between adjacent sub-pixels emitting light of different wavelengths.

7. The display device of claim 5,
wherein a first distance corresponds to a distance from a center of a second opening to a center of a nearest adjacent first electrode, a second distance corresponds to a distance from the center of the second opening to a center of another nearest adjacent first electrode, and the first distance is substantially equal to the second distance.

8. A method of manufacturing an organic light-emitting display device, comprising:
forming a plurality of first electrodes, wherein each first electrode corresponds to a sub-pixel;
forming a pixel-defining layer comprising a plurality of first openings and a plurality of cavities formed on an upper surface of the pixel-defining layer, wherein the plurality of cavities have a depth and are selectively formed between adjacent sub-pixels emitting light of a same wavelength, wherein the first openings expose at least a portion of the first electrodes;
forming an intermediate layer including an organic material on the exposed portion of the first electrodes; and
forming an opposite electrode on the intermediate layer and the pixel-defining layer.

9. The method of claim 8, wherein the plurality of cavities include a plurality of inlets having the depth smaller than a thickness of the pixel defining layer, the method further comprising:
forming the intermediate layer on the exposed portion of the first electrode and in the inlets,
wherein the inlets are selectively formed between adjacent sub-pixels emitting light of a same wavelength.

10. The method of claim 9, wherein a first distance corresponds to a distance between respective centers of two adjacent drops of intermediate layer disposed at a first opening, a second distance corresponds to a distance from a center of an edgemost drop of intermediate layer disposed at the first opening and a center of an immediate adjacent drop of intermediate layer discharged at an inlet, and the first distance is substantially equal to the second distance.

11. The method of claim 9, wherein forming the pixel-defining layer further comprises forming the first openings and the inlets in a same process step.

12. The method of claim 8,
wherein the plurality of inlets are omitted between adjacent sub-pixels emitting light of different wavelengths.

13. The method of claim 8, wherein the plurality of cavities include a plurality of second openings having the depth equal to a thickness of the pixel defining layer, the method further comprising:
forming the intermediate layer on the exposed portions of the first electrodes and the substrate,
wherein the second openings are selectively formed between adjacent sub-pixels emitting light of a same wavelength.

14. The method of claim 13, wherein the second openings are omitted between adjacent sub-pixels emitting light of different wavelengths.

15. The method of claim 13, wherein a first distance corresponds to a distance from a center of a second opening to a center of a nearest adjacent first electrode, a second distance corresponds to a distance from the center of the second opening to a center of another nearest adjacent first electrode, and the first distance is substantially equal to the second distance.

16. The method of claim 13, wherein forming the pixel-defining layer further comprises forming the first openings and the second openings in a same process step.

17. The method of claim 8, further comprising forming the intermediate layer using an inkjet printing process.

18. The method of claim 17, wherein forming the intermediate layer further comprises dispensing an ink, at a constant pitch, on the exposed portion of the first electrodes and into a plurality of inlets, wherein the inlets are formed on an upper surface of the pixel-defining layer.

19. The method of claim 17, wherein forming the intermediate layer further comprises dispensing an ink, at a constant pitch, on the exposed portions of the first electrodes and a substrate, wherein the portion of the substrate is exposed through a plurality of second openings formed in the pixel-defining layer.

* * * * *